(12) United States Patent
Chung

(10) Patent No.: US 7,968,075 B2
(45) Date of Patent: Jun. 28, 2011

(54) MULTI-ELEMENT METAL CHALCOGENIDE AND METHOD FOR PREPARING THE SAME

(75) Inventor: Jun-Wen Chung, Tainan County (TW)

(73) Assignees: Jun-Wen Chung, Tainan County (TW); Heliohawk Optoelectronics Corp., Taoyuan County (TW)

( * ) Notice: Subject to any disclaimer, the term of this patent is extended or adjusted under 35 U.S.C. 154(b) by 0 days.

(21) Appl. No.: 12/715,804

(22) Filed: Mar. 2, 2010

(65) Prior Publication Data

US 2010/0227066 A1  Sep. 9, 2010

(30) Foreign Application Priority Data

Mar. 4, 2009 (TW) ................................ 98106929 A

(51) Int. Cl.
  *C01B 17/00* (2006.01)
  *C01B 19/00* (2006.01)

(52) U.S. Cl. ........ 423/508; 423/509; 423/511; 977/811; 977/824

(58) Field of Classification Search ............... 106/31.13; 419/48; 423/508, 509, 511; 204/192.1; 977/811, 977/824
See application file for complete search history.

(56) References Cited

U.S. PATENT DOCUMENTS

| | | | |
|---|---|---|---|
| 6,126,740 A | | 10/2000 | Schulz et al. |
| 2008/0075844 A1* | | 3/2008 | Ha et al. ............... 427/126.1 |
| 2009/0107834 A1* | | 4/2009 | Ye et al. .................. 204/192.15 |
| 2009/0260670 A1* | | 10/2009 | Li ............................... 136/244 |
| 2010/0108503 A1* | | 5/2010 | Bartholomeusz et al. ........... 204/298.13 |
| 2010/0227066 A1* | | 9/2010 | Chung ......................... 427/256 |

FOREIGN PATENT DOCUMENTS

JP  3-244589 A * 10/1991
JP  5-70937 A * 3/1993

OTHER PUBLICATIONS

Carmalt C. Morrison D, Parkin I. "Solid-state and solution phase metathetical synthesis of copper indium chalcogenides", Journal of Materials Chemistry 8(10), Jul. 22, 1998, pp. 2209-2211.
Malik MA, O'Brien P. Revaprasadu N. "A Novel Route for the Preparation of CuSe and $CuInSe_2$ Nanoparticles", Advanced Materials 11: No. 17, Aug. 1999, pp. 1441-1444.
Grisaru H. Palchik O. Gedanken A, Palchik V. Slifkin MA, Weiss AM. "Microwave-Assisted Polyol Synthesis of $CuInTe_2$ and $CuInSe_2$ Nanoparticles", Inorganic Chemistry 42: No. 22, Mar. 2003, pp. 7148-7155.
Li B, Xie Y, Huang JX, Qian YT. "Synthesis by a Solvothermal Route and Characterization of $CuInSe_2$ Nanowhiskers and Nanoparticles", Advanced Materials 11: No. 17, 1999, pp. 1456-1459.
Jiang Y, Wu Y, Mo X, Yu WC, Xie Y, Qian YT. "Elemental Solvothermal Reaction To Produce Ternary Semiconductor $CuInE_2$ (E=S,Se) Nanorods", Inorganic Chemistry 39, Jun. 21, 2000, pp. 2964-2965.
Chun YG, Kim KH, Yoon KH. "Synthesis of $CuInGaSe_2$ nanoparticles by solvothemal route", Thin Solid Films 480, Dec. 8, 2004, pp. 46-49.

* cited by examiner

*Primary Examiner* — Timothy C Vanoy
(74) *Attorney, Agent, or Firm* — Muncy, Geissler, Olds & Lowe, PLLC

(57) ABSTRACT

A multi-element metal chalcogenide and a method for preparing the same are provided. The multi-element metal chalcogenide includes multiple metal elements. A multi-element metal chalcogenide powder is prepared, and all of the multiple metal elements of the multi-element metal chalcogenide are derived from at least one of simple substance powders of the metal elements and one or more alloy powders mixed in accordance with a mole ratio. A solution phase synthesis of the powder of the multi-element metal chalcogenide is then conducted under normal pressure to prepare the multi-element metal chalcogenide. The multi-element metal chalcogenide can be coated to obtain a film or used to make a target and then bombard the target for sputtering a film. In such a way, a selenization process which is conventional in fabricating the semiconductor solar cell is eliminated, thus improving production yield and efficiency.

18 Claims, 9 Drawing Sheets

MULTI-ELEMENT METAL CHALCOGENIDE AND METHOD FOR PREPARING THE SAME

BACKGROUND OF THE INVENTION

1. Field of the Invention

The present invention relates generally to a multi-element metal chalcogenide and a method for preparing the same, and more particularly, to a multi-element metal chalcogenide adapted for being applied in a semiconductor solar cell, and a method for preparing such a multi-element metal chalcogenide. According to the present invention, the multi-element metal chalcogenide includes multiple metal elements. According to the method of preparing the multi-element metal chalcogenide, a powder of the multi-element metal chalcogenide is prepared, and all of the multiple metal elements of the multi-element metal chalcogenide are derived from simple substance powders of the metal elements, and/or one or more alloy powders mixed in accordance with a mole ratio. Then, a solution phase synthesis of the powder of the multi-element metal chalcogenide is conducted under the normal pressure to prepare the multi-element metal chalcogenide. The multi-element metal chalcogenide can be coated to obtain a film to make a target and then bombard the target for sputtering a film. In such a way, a selenization process which is conventional in fabricating the semiconductor solar cell is eliminated, thus improving the production yield and efficiency.

2. The Prior Arts

Copper-Indium-Gallium-Selenide (CIGS) solar cell was proposed by University of Maine in 1997, and the CIGS solar cell of that time has achieved a cell-efficiency of 6%. Up to now, it is known that a highest record of the cell-efficiency of CIGS solar cells is 19.9%, announced by the National Renewable Energy Laboratory (NREL) of the U.S. Department of Energy in 2008. Such CIGS solar cell not only has reached a high efficiency, but also can be stably used for a long time. As such, it is desired to be wildly applied in many different fields, including electric generation plants, or building materials.

"CIGS" of the CIGS solar cell represents $Cu(In_{1-x}Ga_x)Se_2$, a major ingredient of an active layer of the solar cell. The active layer is adapted for absorbing sunlight and converting the energy of the sunlight into electric current. The CIGS active layer of the CIGS solar cell announced as having the 19.9% efficiency is a CIGS thin film having multiple metal elements of copper (Cu) indium (In), gallium (Ga), and selenide (Se). In accordance with a conventional method, such a CIGS thin film is fabricated by conducting a high-vacuum multi-source co-evaporation to deposit metal elements of Cu, In, Ga, and Se onto a substrate at the same time, while the substrate is being maintained under a temperature of 500° C. to 600° C. According to a principle of the high-vacuum multi-source co-evaporation, four individual evaporation sources of Cu, In, Ga, and Se are provided in a same vacuum chamber, and evaporated with individually controlled evaporation rates while the substrate is being maintained under a high temperature. In such a way, the Cu, In, Ga, and Se elements are simultaneously deposited onto the substrate, thus forming a CIGS thin film thereon. However, the CIGS thin film prepared by this conventional method usually has a low utilization rate, a nonuniform film thickness, and a nonuniform homogenicity. Further, the substrate is required to be maintained under a high temperature, and this adversely affects the production yield, increases the production cost, and restricts the production of large scale thin films.

In accordance with another method for preparing a CIGS thin film, a CIG thin film is prepared by bombarding a single target of a metal alloy containing Cu, In, and Ga (CIG alloy) or pre-depositing a metal precursor of a binary alloy. Then, the CIG thin film is disposed in a high temperature environment, and a Se vapor, a hydrogen selenide ($H_2Se$) gas, or a hydrogen sulfide ($H_2S$) gas is introduced to conduct a selenization or sulfuration process, thus obtaining a CIGS thin film. However, the selenization or sulfuration process is a complex and time-consuming process. It requires a high operation temperature, increases the process cost, and lowers the production speed. Moreover, it employs the highly toxic gas, $H_2Se$, which requires a higher rank of security protection and corresponding protection cost.

In addition, for the purpose of improving the raw material utilization and production efficiency, and producing large scale CIGS thin films, other methods including electrodeposition, chemical vapor deposition (CVD), and spray deposition, had been proposed. However, these conventional methods are restricted by the unsatisfactory cell-efficiencies, raw material utilization, or crystalline thereof.

Even further, it has been found that ink-jet printing is an alternative method for preparing the CIGS thin film, and is adapted for improving the raw material utilization and preparing large scale CIGS thin films. Unfortunately, the cell efficiency of the CIGS thin film prepared by the ink-jet printing method is relatively low. In addition, the ink jet printing method requires to introduce hydrogen for reduction and to introduce $H_2S$ gas for selenization under a high temperature. Further, the crystalline of the thin film is usually not good enough, and the ink is not easy to prepare. As such, the ink-jet method is also not a proper one for alternation.

Furthermore, there are several methods for synthesizing CIGS nano-particles proposed as following.

Carmalt et al. proposed in Journal of Materials Chemistry 8: 2209-11, 1998, to prepare a CIGS thin film by conducting a solution phase metathesis synthesis with a metal halide and a sodium chalcogenide, and heating the precursor in toluene for 72 hours.

Further, U.S. Pat. No. 6,126,740, issued to Schulz et al. proposed to prepare a CIGS thin film by dissolving cuprous iodide (CuI), indium iodide ($InI_3$), gallium iodide ($GaI_3$), and sodium selenide ($Na_2Se$) into pyridine, and having them reacted therein.

Further, Malik et al. proposed in Advanced Materials 11: 1441-4, 1999, a hot injection method for preparing a CIGS thin film. In accordance with the hot injection method, cuprous chloride (CuCl) and indium chloride ($InCl_3$) are dissolved in trioctylphosphine (TOP hereinafter) to form a metal complex, and then trioctylphosphine oxide (TOPO hereinafter) is introduced therein, and then trioctylphosphine selenide (TOPSe hereinafter) is introduced therein for reaction, thus obtaining copper indium diselenide (CIS). However, this hot injection method can only obtain a ternary compound, and the obtained ternary compound even contains byproducts of cuprous selenide ($Cu_2Se$) and indium oxide ($In_2O_3$) and is difficult to purify.

Pyrolysis is another known method for preparing a CIGS thin film, in which a $(PPh_3)_2CuIn(SePh)_4$ metal complex is prepared at first, and then the metal complex is sprayed into a high temperature environment for pyrolysis therein and obtaining CIS powders.

Further, Grisaru et al. proposed in Inorganic Chemistry 42: 7148-55, 2003, microwave-assisted synthesis method for preparing a CIGS thin film. According to the microwave-assisted synthesis method, precursors including CuCl powder, In powder, and Se powder are dissolved in ethylene glycol, and microwave energy is then applied for pyrolysing the solution to obtain the CIS powder. However, the CIS obtained by such a process still contains Cu$_2$Se byproduct and is still difficult to purify.

Furthermore, Li et al. proposed in Advanced Materials 11: 1456-9, 1999, a solvothermal method. According to the solvothermal method, CuCl$_2$, InCl$_3$, and Se powder are dissolved in ethylenediamine and diethylamine, and the solution is contained in an autoclave for reacting therein under a high pressure and high temperature for more than 15 hours, thus obtaining the CIS powder.

Still further, Jiang et al., proposed in Inorganic Chemistry 39:2964, to modify the precursors by substituting the halides of the with pure elements.

Moreover, Chun Y G et al., in Thin Solid Films 480:46-9, 2005, further proposed to synthesize Cu, In, Ga, and Se into CIGS powder with this method. However, this process is restricted by the reaction condition to be applied in a mass production.

In summary, all of the foregoing technologies have disadvantages. Some of them can be used for preparing ternary compound only, some of them require high temperature and high pressure conditions, while the products of some contains halide ions.

As such, it is highly desired to develop a multi-element metal chalcogenide adapted for being applied in a semiconductor solar cell, and a method for preparing such a multi-element metal chalcogenide. According to the present invention, the multi-element metal chalcogenide includes multiple metal elements. And according to the method of preparing the multi-element metal chalcogenide, a powder of the multi-element metal chalcogenide is prepared, and all of the multiple metal elements of the multi-element metal chalcogenide are derived from simple substance powders of the metal elements, and/or one or more alloy powders mixed in accordance with a mole ratio. Then, a solution phase synthesis of the powder of the multi-element metal chalcogenide is conducted under the normal pressure to prepare the multi-element metal chalcogenide. The solution phase synthesis can be conducted under a normal pressure, and does not require high pressure and high temperature operation conditions. The product does not contain any halide ions, and is adapted for mass production.

SUMMARY OF THE INVENTION

Accordingly, a primary objective of the present invention is to provide a multi-element metal chalcogenide adapted for being applied in a semiconductor solar cell, and a method for preparing such a multi-element metal chalcogenide. According to the present invention, the multi-element metal chalcogenide includes multiple metal elements. According to the method of preparing the multi-element metal chalcogenide, a powder of the multi-element metal chalcogenide is prepared, and all of the multiple metal elements of the multi-element metal chalcogenide are derived from simple substance powders of the metal elements, and/or one or more alloy powders mixed in accordance with a mole ratio. Then, a solution phase synthesis is conducted under the normal pressure to prepare the multi-element metal chalcogenide. The solution phase synthesis can be conducted under a normal pressure, and does not require high pressure operation condition. The product does not contain any halide ions, and is adapted for mass production.

Another objective of the present invention is to provide a multi-element metal chalcogenide and a method for preparing such the same. According to the present invention, a nano-scale CIGS powder can be conveniently produced in a large scale under an ambient atmosphere pressure. Such a nano-scale CIGS powder does not contain halide ions. A CIGS compound material is then made of the nano-scale CIGS powder. The mole ratios of the Cu, In, Ga, and Se ingredients of the CIGS compound material can be adjusted within a certain range as desired, for improving the cell-efficiency according to the processing requirement. Further, the CIGS compound material can be used to fabricate uniform-ingredient ink and sputtering target which are adapted for conducting a stable process and producing a high quality CIGS thin film.

A further objective of the present invention is to provide a multi-element metal chalcogenide and a method for preparing such the same. According to the present invention, a CIGS compound material is obtained. The CIGS compound material is adapted for an active layer of a semiconductor solar cell. The CIGS compound material can be coated to obtain a film or used to make a target and then bombard the target for sputtering a film. In such a way, a selenization process which is conventional in fabricating the semiconductor solar cell is eliminated, thus improving the production yield and efficiency.

For achieving the foregoing objectives and others, the present invention provides a multi-element metal chalcogenide and a method for preparing such the same. According to the present invention, a binder is formed under a certain synthesis condition by aromatics or arylamine. Such a binder has a high boiling point, alkalescence, and a chelating ability, and is thus adapted for preparing a high purity multi-element metal chalcogenide, e.g., nano-scale CIGS powder, having no halide ions in a large scale. According to a method for preparing the nano-scale CIGS powder, all of the multiple metal elements of the multi-element metal chalcogenide are derived from simple substance powders of the metal elements (e.g., Cu, In, Ga, and Se pure element powders), and/or one or more alloy powders (e.g., Cu/In alloy powder, Cu/Ga alloy powder, and Se powder) mixed in an organic solvent in accordance with a mole ratio for reaction. During the reaction process, the operation temperature is maintained above 240° C. The organic solvent has a boiling point at least higher than 240° C., and a pH value between 7 and 10.

The nano-scale multi-element metal chalcogenide CIGS powder can be sintered and pressed under a high temperature to obtain a sputtering target. Such a sputtering target is adapted for conducting a sputtering process to obtain a CIGS thin film. The ingredients of such a thin film are uniform and homogeneous in its entirety, and do not vary in accordance with the processing time of the sputtering process. As such the ingredients of the thin film are controllable, and the thin film does not require a selenization process. Accordingly, the present invention simplifies the production process, saves the production cost, and improving the yield of the CIGS thin film solar cells.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Figure 1:
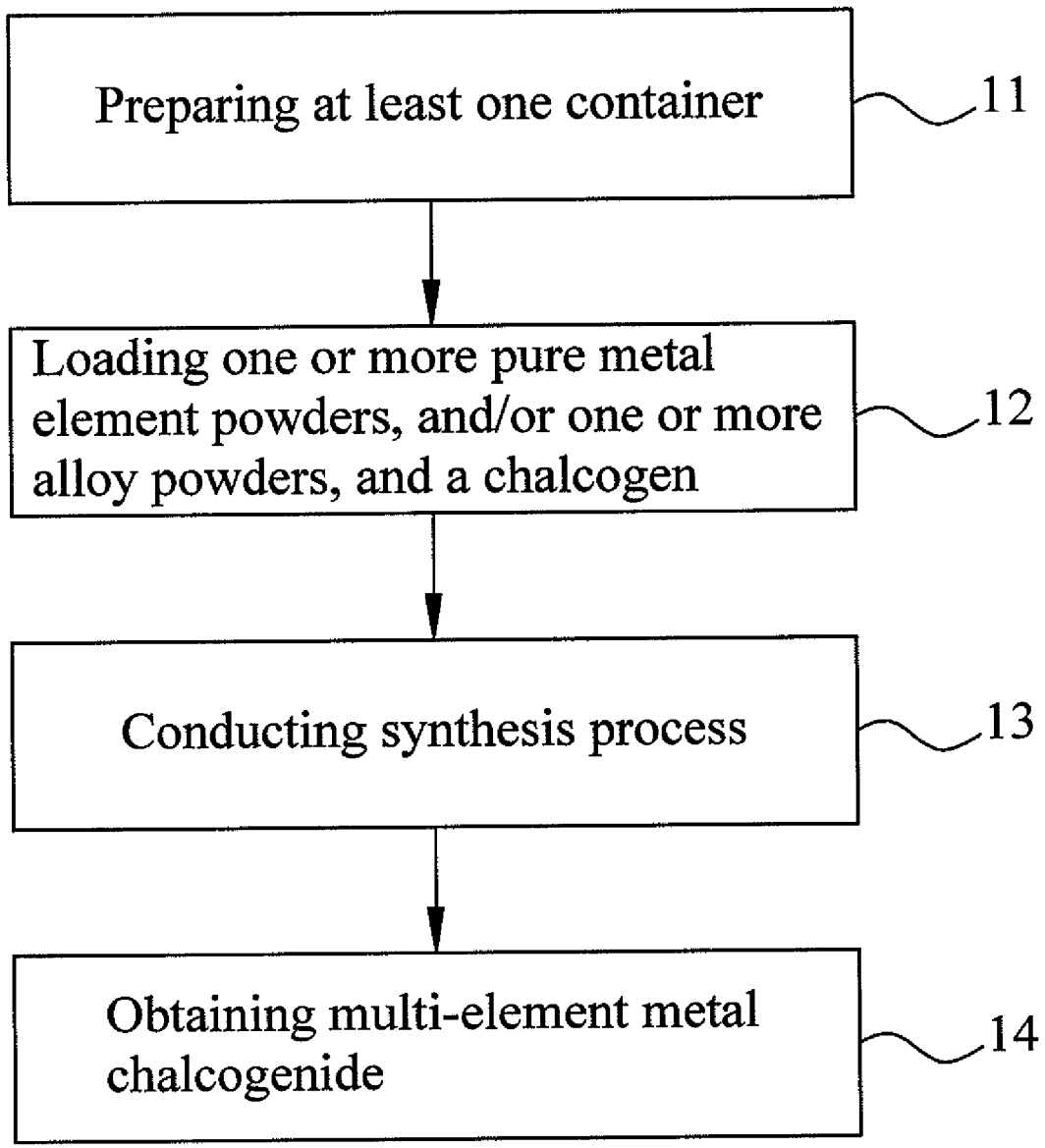
FIG. 1 is a flow chart illustrating steps of a method for preparing a multi-element metal chalcogenide of the present invention.

The accompanying drawings are included to provide a further understanding of the invention, and are incorporated in and constitute a part of this specification. The drawing illustrates embodiments of the invention and, together with the description, serves to explain the principles of the invention.

FIG. 1 is a flow chart illustrating steps of a method for preparing a multi-element metal chalcogenide of the present invention. Referring to FIG. 1, at step 11, a container is prepared, and then the flow goes to step 12.

At step 12, at least one or more pure metal element powders, and/or one or more alloy powders, and a chalcogen are added into the container for executing a reaction to obtain a multi-element metal chalcogenide. The metal elements of the multi-element metal chalcogenide are derived from simple substance powders of the metal elements (e.g., Cu, In, Ga, and Se pure element powders), and/or one or more alloy powders (e.g., Cu/In alloy powder, Cu/Ga alloy powder, and Se powder). The simple substance powders of the metal elements (e.g., Cu, In, Ga, and Se pure element powders), and/or one or more alloy powders (e.g., Cu/In alloy powder, Cu/Ga alloy powder, and Se powder) and the chalcogen, e.g., S and/or Se, and/or Te, are mixed in accordance with a predetermined mole ratio in the container, and then the flow goes to step 13.

At step 13, an organic solvent having a boiling point higher than 240° C., and a pH value between 7 and 10 is introduced into the container for uniformly mixing the simple substance powders of the metal elements (e.g., Cu, In, Ga, and Se pure element powders), and/or the one or more alloy powders (e.g., Cu/In alloy powder, Cu/Ga alloy powder, and Se powder) and the chalcogen, e.g., S and/or Se, and/or Te together. The, the organic solvent, the simple substance powders of the metal elements, and/or the one or more alloy powders, and the chalcogen are heated to a reaction temperature for synthesizing the multi-element metal chalcogenide. The reaction temperature is maintained above 200° C. Then, the flow goes to step 14.

At step 14, the multi-element metal chalcogenide is conducted with a cooling down step, a precipitation step, a filtering step, a flushing step, and a drying step, so as to finally obtain a nano-scale powder of the multi-element metal chalcogenide.

The method of preparing multi-element metal chalcogenide of the present invention is adapted for synthesizing nano-scale GIGS compound particles under an ambient atmosphere pressure. The organic solvent can be either a single solvent or a mixture of at least two kinds.

According to an aspect of the embodiment, all of the metal elements of the nano-scale CIGS powder of the multi-element metal chalcogenide are derived from simple substance powders of the metal elements (e.g., Cu, In, Ga, and Se pure element powders). In this case, the chemical reaction of the present invention is as following:

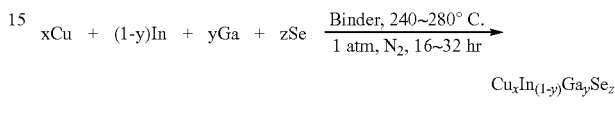

$x = 0.8\sim1.2, y = 0\sim1.0, z = 1.6\sim2.4$
if $y > 0$, the reaction temperature must high than 240° C.

where, x ranges between 0.8 and 1.2, y ranges between 0 and 1.0, z ranges between 1.6 and 2.4, and when y is greater than 0, the reaction temperature must be higher than 240° C. According to the embodiment of the present invention, the multi-element metal chalcogenide is a quaternary metal chalcogenide, and the formula of the quaternary metal chalcogenide is $Cu_x(In_{1-y}Ga_y)Se_z$, where $0.8 \leq x \leq 1.2$, $0 \leq y \leq 1.0$, and $1.6 \leq z \leq 2.4$.

The organic solvent can be either selected from aromatic amines or aromatic diamine which can be represented as following (a) to (e) formulas.

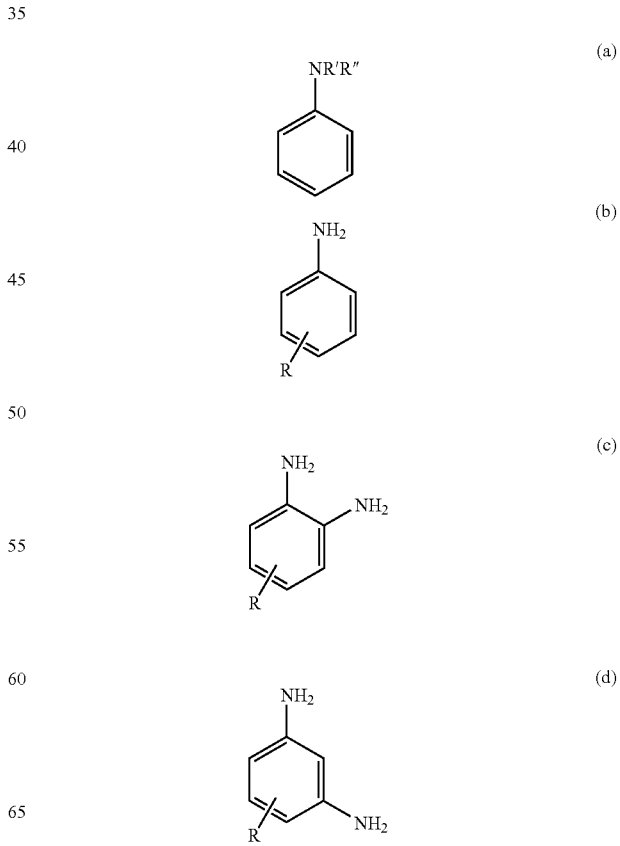

(e)

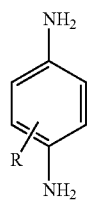

When the organic solvent is selected from aromatic amines, the R' and R" of the above formulas respectively represent two selected from the group consisting of hydrogen atom, aromatic group, amino group having 1 to 5 carbon atoms, and alcohol group having 1 to 5 carbon atoms. The organic solvent is selected from the group consisting of diphenylamine, N-phenylbenzylamine, 2-anilinoethanol, and N-phenylethylene-diamine.

According to a further aspect of the embodiment, when the organic solvent is selected from aromatic amines, the R of the above formulas represents one selected from the group consisting of hydrogen atom, alkyl group having 1 to 10 carbon atoms, amino group having 1 to 10 carbon atoms, alkoxy group having 1 to 10 carbon atoms, nitrile group, and aromatic group. The organic solvent is selected from the group consisting of 4-butylaniline, 2-biphenylylamine, 2-aminobenzonitrile, N,N-diethyl-1,4-phenylenediamine, and o-phenetidine.

When the organic solvent is selected from aromatic diamine, the R' of the above formulas represents one selected from a group consisting of hydrogen atom, alkyl group having 1 to 10 carbon atoms, nitrile group, and aromatic group, and the organic solvent is selected from the group consisting of (1,2-phenylenediamine), (1,3-phenylenediamine), (1,4-phenylenediamine), and (4-methyl-1,3-phenylenediamine).

In accordance with the method of preparing multi-element metal chalcogenide of the present invention, a CIGS multi-element metal chalcogenide, e.g., $Cu_x(In_{1-y}Ga_y)Se_z$ can be prepared.

Further, it should be noted that although Se element, as exemplified above, is used in the method of preparing multi-element metal chalcogenide, S element and Te element can be employed for substitution. Similarly, Ag element can be alternatively employed for substituting Cu element, and Al element can be alternatively employed for substituting In element and Ga element. The principle of corresponding substitution can be learnt by referring to the foregoing teachings, and is not to be iterated hereby.

The nano-scale CIGS powder of the multi-element metal chalcogenide of the present invention can be used for conducting an ink-printing process or a sputtering process. For example, the nano-scale CIGS powder of the multi-element metal chalcogenide can be dispersed in an ink, and the ink can be used serving as a coating material in an ink-printing process for forming a CIGS thin film. Further, the nano-scale CIGS powder of the multi-element metal chalcogenide can be sintered and pressed under a high temperature to obtain a sputtering target. The sputtering target is adapted for forming a CIGS thin film by conducting a sputtering process. The sputtering target can be prepared by sintering and pressing nano-scale CIGS powder obtained by a solution synthesis process. The nano-scale CIGS powder has homogeneous ingredient, and is formed by a sintering process under a high temperature.

The multi-element metal chalcogenide, e.g., CIGS compound, of the present invention can be also used to make a sputtering target. The sputtering target can be bombarded to sputter and deposit a CIGS thin film. The ingredients of such a thin film are uniform and homogeneous in its entirety, and do not vary in accordance with the processing time of the sputtering process. The ingredients of such a thin film are uniform and homogeneous in its entirety, and do not vary in accordance with the processing time of the sputtering process.

Figure 2:
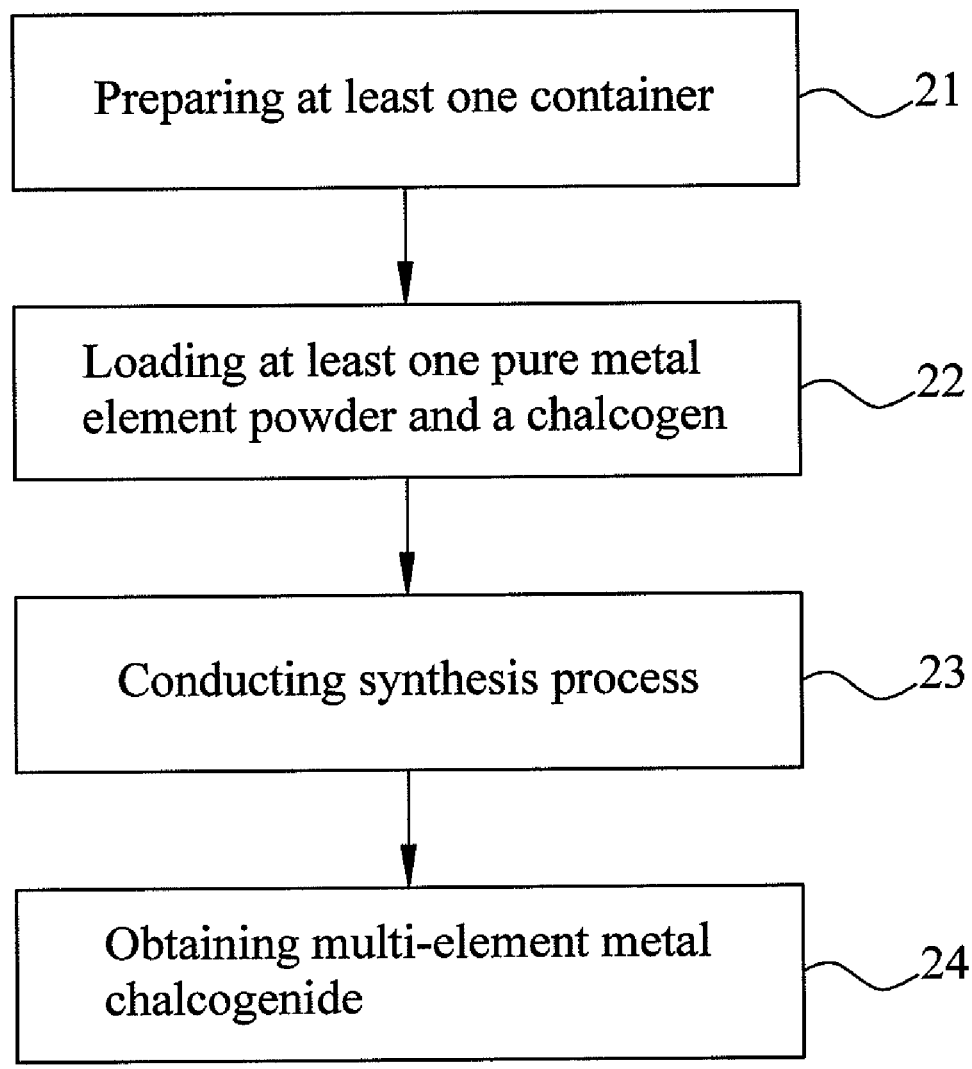
FIG. 2 is a flow chart illustrating a method for preparing a multi-element metal chalcogenide according to an embodiment of the present invention.

FIG. 2 is a flow chart illustrating a method for preparing a multi-element metal chalcogenide according to an embodiment of the present invention.

Referring to FIG. 2, at step 21, at least one container is prepared, and then the flow goes to step 22.

At step 22, a 500 ml container, e.g., a three-necked bottle is heated to 100° C., and then nitrogen is introduced into the container to dewater and deoxidize for one hour. Then, pure simple substances of the metal elements, e.g., 0.06 mole of gallium ingot heated to 30° C., 0.2 mole of copper powder, 0.14 mole of indium powder, and 0.5 mole of selenium powder, are provided with $N_2$—$H_2$ or $N_2$ and maintained under a temperature of 200° C. for about 0.5 hour. Then, the gallium ingot, copper powder, indium powder, and selenium powder are put in the container, in which the mole ratio of the ingredients of the mixture is Co:In:Ga:Se=0.2: 0.14:0.06:0.5. Then, the flow goes to step 23.

At step 23, 1.0 mole of diphenylamine (organic solvent) is prepared and added into the container, i.e., the three-necked bottle, for dissolving the gallium ingot, the copper powder, the indium powder and the selenium powder. The diphenylamine has a boiling point higher than 240° C., and has a pH value between 7 and 10. A magnet is employed to stir the mixture for about 1 hour, and the mixture is slowly heated to 240° C. After the temperature of the mixture is stably maintained at 240° C., the operation condition is maintained 24 hours for reaction, and then the flow goes to step 24.

At step 24, the operation temperature is cooled down to 80° C. or lower, and then 300 ml of dewatered non-solvent (e.g., methanol or toluene) is introduced, so as to deposit, filter, and separate out black CIGS sediment powder. Then, the CIGS sediment powder is then flushed with non-solvent (e.g., methanol or toluene). Then, the CIGS powder is dried in a vacuum environment under a temperature of 50° C. or above for 1 hour, and then separated out by centrifuge. It should be noted that the non-solvent means that it is mutual soluble with the organic solvent, but is incapable of dissolving or dispersing the multi-element metal chalcogenide.

Figure 3:
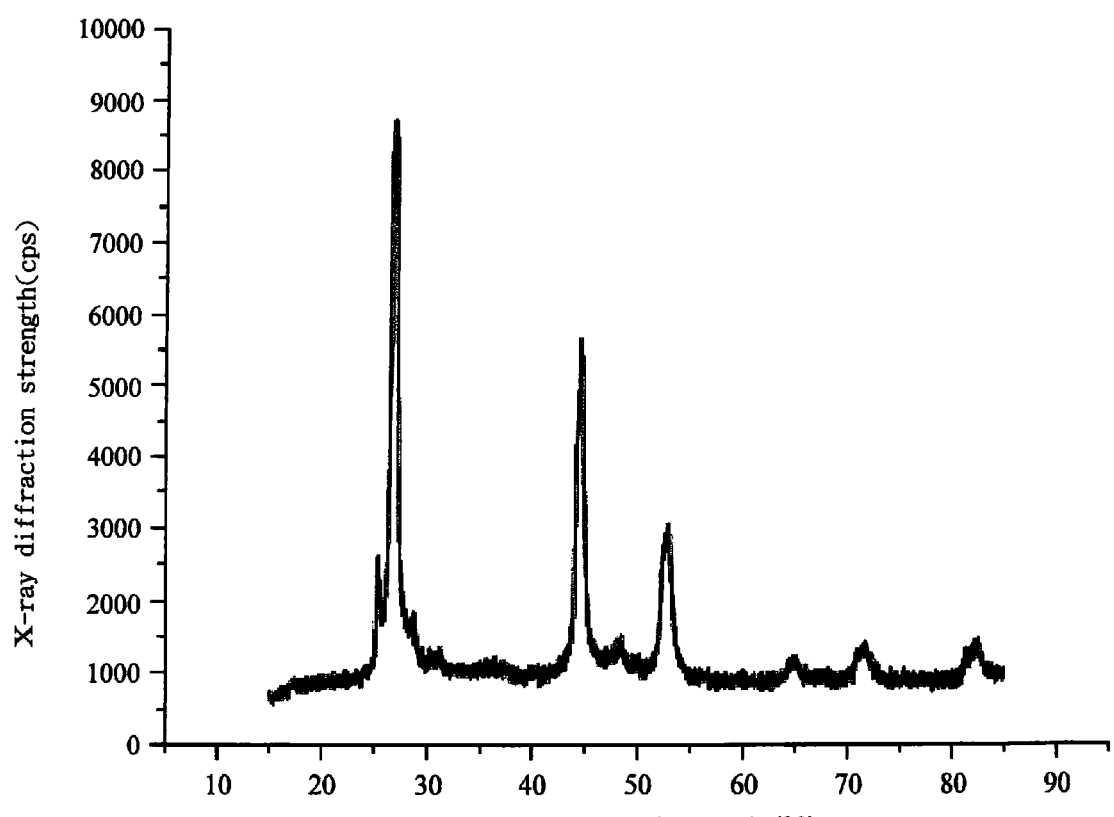
FIG. 3 is a schematic diagram illustrating a crystalline architecture of the multi-element metal chalcogenide of FIG. 2.

FIG. 3 is a schematic diagram illustrating a crystalline architecture of the multi-element metal chalcogenide of FIG. 2. Referring to FIG. 3, there is shown an X-ray diffraction (XRD) analysis pattern of the CIGS powder obtained in accordance with the embodiment of FIG. 2. As shown in FIG. 3, characteristic peaks of the $Cu(In,Ga)Se_{2.5}$ include 112(27.38), 204/220(44.88), 116/312(53.13), 008/400(65.2), 316/332(71.83), 228/424(82.81). Meanwhile, characteristic peaks of $Cu_3Se_2$, 110(25.12) and (48.43) are also detected. As determined by an energy dispersive X-ray spectroscopy (EDS), the mole ratio of Cu/(In+Ga) is about 1.0, and the mole ratio of Ga/(In+Ga) is about 0.3. The byproduct $Cu_3Se_2$ is detected because of the employment of excessive Se.

Figure 4:
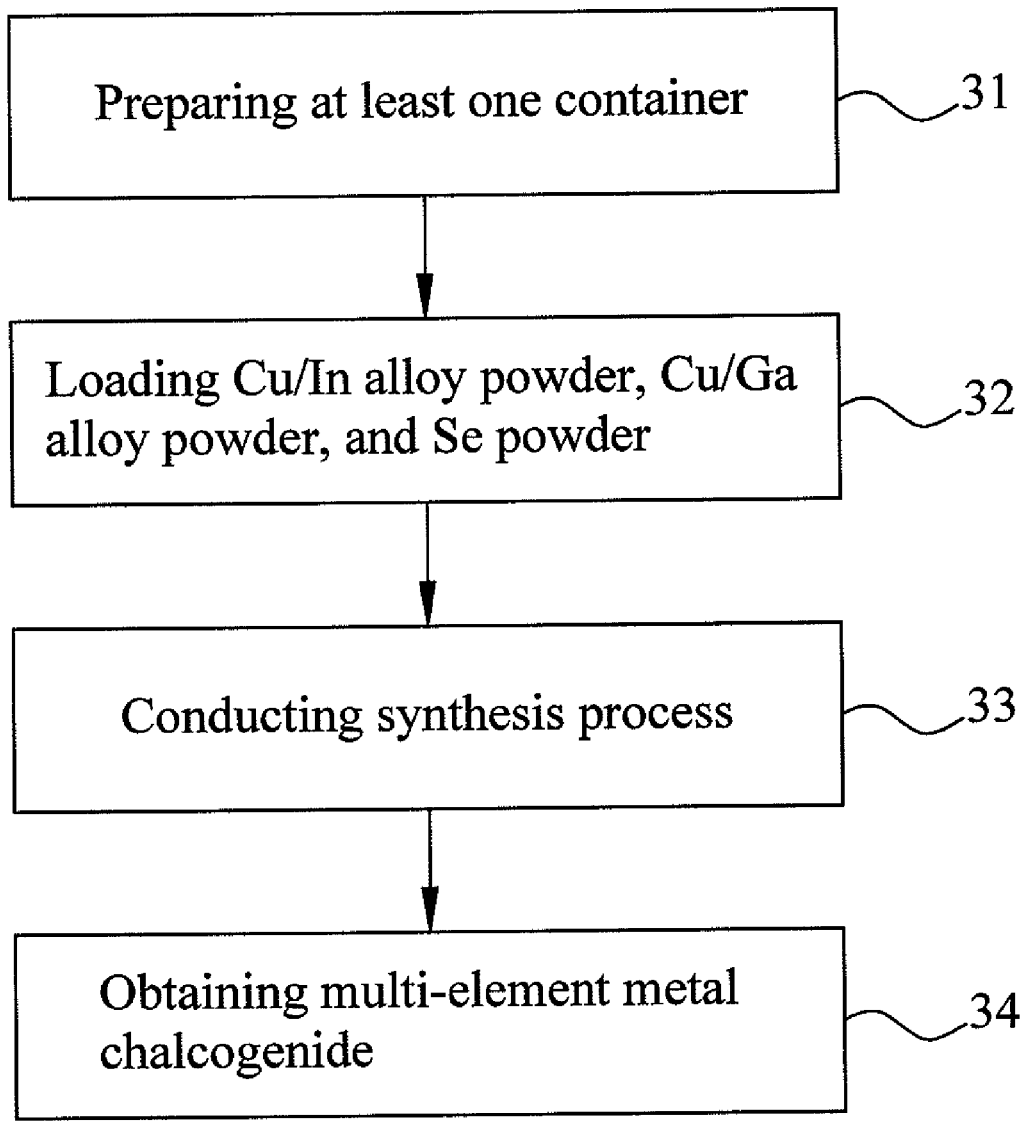
FIG. 4 is a flow chart illustrating a method for preparing another multi-element metal chalcogenide according to a further embodiment of the present invention.

FIG. 4 is a flow chart illustrating a method for preparing another multi-element metal chalcogenide according to a further embodiment of the present invention.

Referring to FIG. 4, at step 31, at least one container is prepared, and then the flow goes to step 32.

At step 32, the 500 ml container, e.g., a three-necked bottle is heated to 100° C., and then nitrogen is introduced into the container to dewater and deoxidize for one hour. Then, one or more alloy powders, e.g., Cu/In alloy powder, Cu/Ga alloy powder, and selenium powder, are provided with $N_2$—$H_2$ or $N_2$ and maintained under a temperature of 200° C. for about 0.5 hour. The particle size of the Cu/In alloy powder and the Cu/Ga alloy powder is less than 100 μm, and the particle size of the selenium powder is small than 300 mesh. The Cu/In alloy powder, Cu/Ga alloy powder, and the selenium powder are put in the container, in which the mole ratio of the ingredients of the mixture is Co:In:Ga:Se=0.2:0.14:0.06:0.5. Then, the flow goes to step 33.

At step 33, 0.6 mole of diphenylamine (organic solvent) is prepared and added into the container, i.e., the three-necked bottle, for dissolving the Cu/In alloy powder, the Cu/Ga alloy powder, and the selenium powder. The diphenylamine has a boiling point higher than 240° C., and has a pH value between 7 and 10. A magnet is employed to stir the mixture for about 1 hour, and the mixture is slowly heated to 240° C. After the temperature of the mixture is stably maintained at 240° C., the operation condition is maintained 24 hours for reaction, and then the flow goes to step 34.

At step 34, the operation temperature is cooled down to 80° C. or lower, and then 300 ml of dewatered non-solvent (e.g., methanol or toluene) is introduced, so as to deposit, filter, and separate out black CIGS sediment powder. Then, the CIGS sediment powder is then flushed with non-solvent (e.g., methanol or toluene). Then, the CIGS powder is dried in a vacuum environment under a temperature of 50° C. or above for 1 hour, and then separated out by centrifuge. It should be noted that the non-solvent means that it is mutual soluble with the organic solvent, but is incapable of dissolving or dispersing the multi-element metal chalcogenide.

Comparing with the embodiment of FIG. 2, the embodiment of FIG. 4 employs Cu/In alloy powder and Cu/Ga alloy powder, instead of single element substances. In such a way, the reaction time of synthesizing the CIGS powder can be shortened, and the proportion of the raw material is relatively easy to control. Further, it is convenient to synthesize the CIGS powder, $(Cu_x(In_{1-y}Ga_y)Se_z)$, which is more convenient to sinter and does not require selenization.

Figure 5:
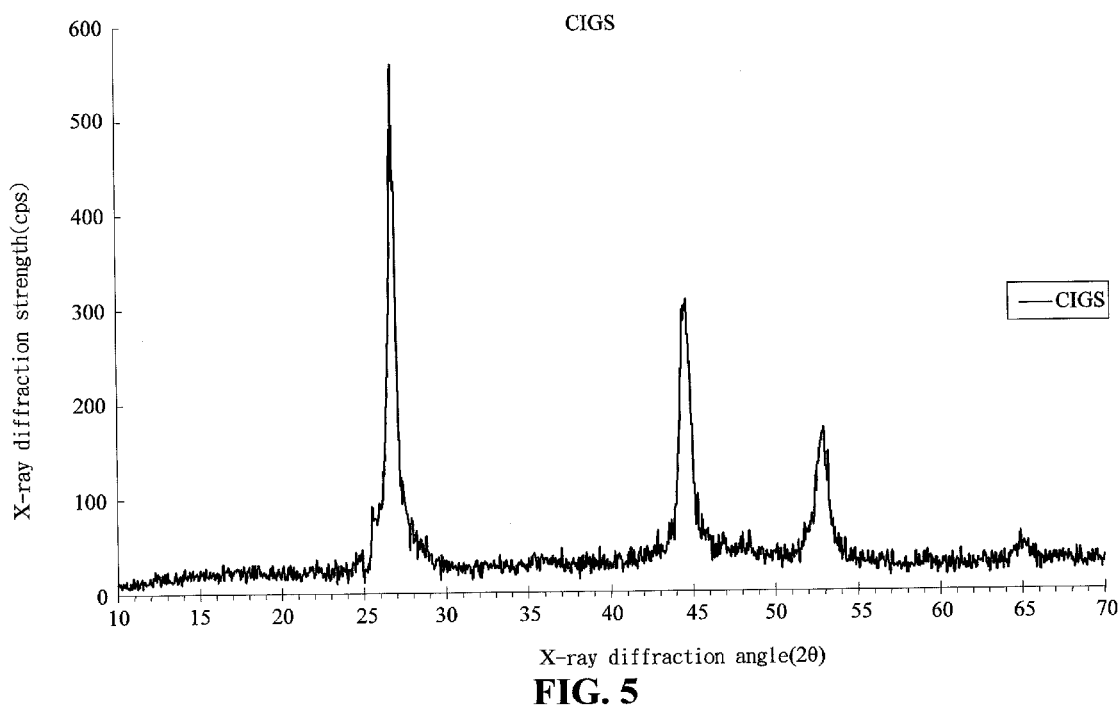
FIG. 5 is a schematic diagram illustrating a crystalline architecture of the multi-element metal chalcogenide of FIG. 4.

FIG. 5 is a schematic diagram illustrating a crystalline architecture of the multi-element metal chalcogenide of FIG. 4. Referring to FIG. 5, there is shown an X-ray diffraction (XRD) analysis pattern of the CIGS powder obtained in accordance with the embodiment of FIG. 4. As shown in FIG. 5, characteristic peaks of the $Cu(In,Ga)Se_2$ include 112(26.90), 204/220(44.65), and 116/312(52.95). Meanwhile, a characteristic peak of $Cu_3Se_2$, 110(25.12) is also detected. As determined by an energy dispersive X-ray spectroscopy (EDS), the mole ratio of Cu/(In+Ga) is about 1.0, and the mole ratio of Ga/(In+Ga) is about 0.3. The byproduct $Cu_3Se_2$ is detected because of the employment of excessive Se.

Figure 6:
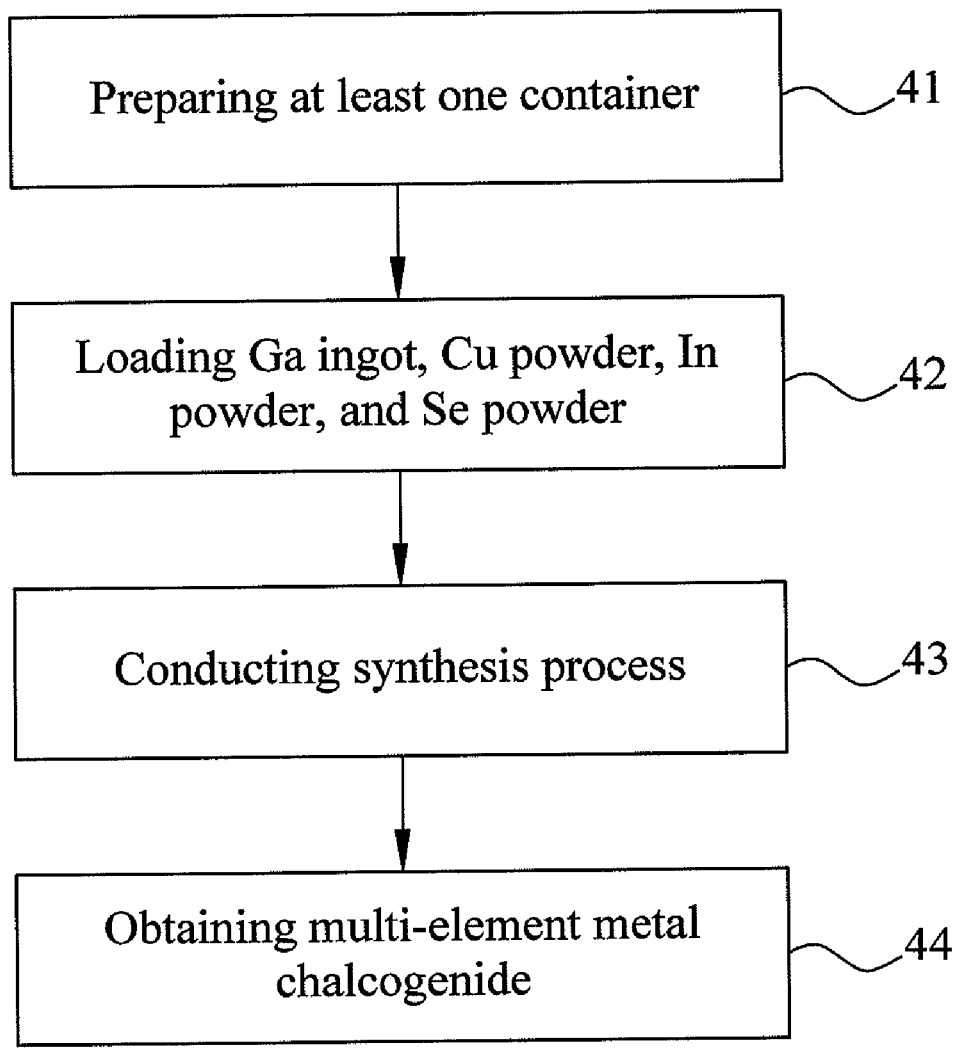
FIG. 6 is a flow chart illustrating a method for preparing a further multi-element metal chalcogenide according to a still further embodiment of the present invention.

FIG. 6 is a flow chart illustrating a method for preparing a further multi-element metal chalcogenide according to a still further embodiment of the present invention.

Referring to FIG. 6, at step 41, at least one container is prepared, and then the flow goes to step 42.

At step 42, a 500 ml container, e.g., a three-necked bottle is heated to 100° C., and then an inert gas (e.g., nitrogen, helium, or argon) is introduced into the container to dewater and deoxidize for one hour. Then, pure simple substances of the metal elements, e.g., 0.04 mole of gallium ingot heated to 30° C., 0.18 mole of copper powder, 0.16 mole of indium powder, and 0.44 mole of selenium powder, are provided with $N_2$—$H_2$ or $N_2$ and maintained under a temperature of 200° C. for about 0.5 hour. Then, the gallium ingot, copper powder, indium powder, and selenium powder are put in the container, in which the mole ratio of the ingredients of the mixture is Co:In:Ga:Se=0.18:0.16:0.04:0.38. Then, the flow goes to step 43.

At step 43, 1.2 mole of 2-aminobenzonitrile (organic solvent) is prepared and added into the container, i.e., the three-necked bottle, for dissolving the gallium ingot, the copper powder, the indium powder and the selenium powder. The 2-aminobenzonitrile has a boiling point higher than 240° C., and has a pH value between 7 and 10. A magnet is employed to stir the mixture for about 1 hour, and the mixture is slowly heated to 240° C. After the temperature of the mixture is stably maintained at 240° C., the operation condition is maintained 24 hours for reaction, and then the flow goes to step 44.

At step 44, the operation temperature is cooled down to 80° C. or lower, and then 160 ml of dewatered non-solvent (e.g., methanol or toluene) is introduced, so as to deposit, filter, and separate out black CIGS sediment powder. Then, the CIGS sediment powder is then flushed with non-solvent (e.g., methanol or toluene). Then, the CIGS powder is dried in a vacuum environment under a temperature of 50° C. or above for 1 hour.

Figure 7:
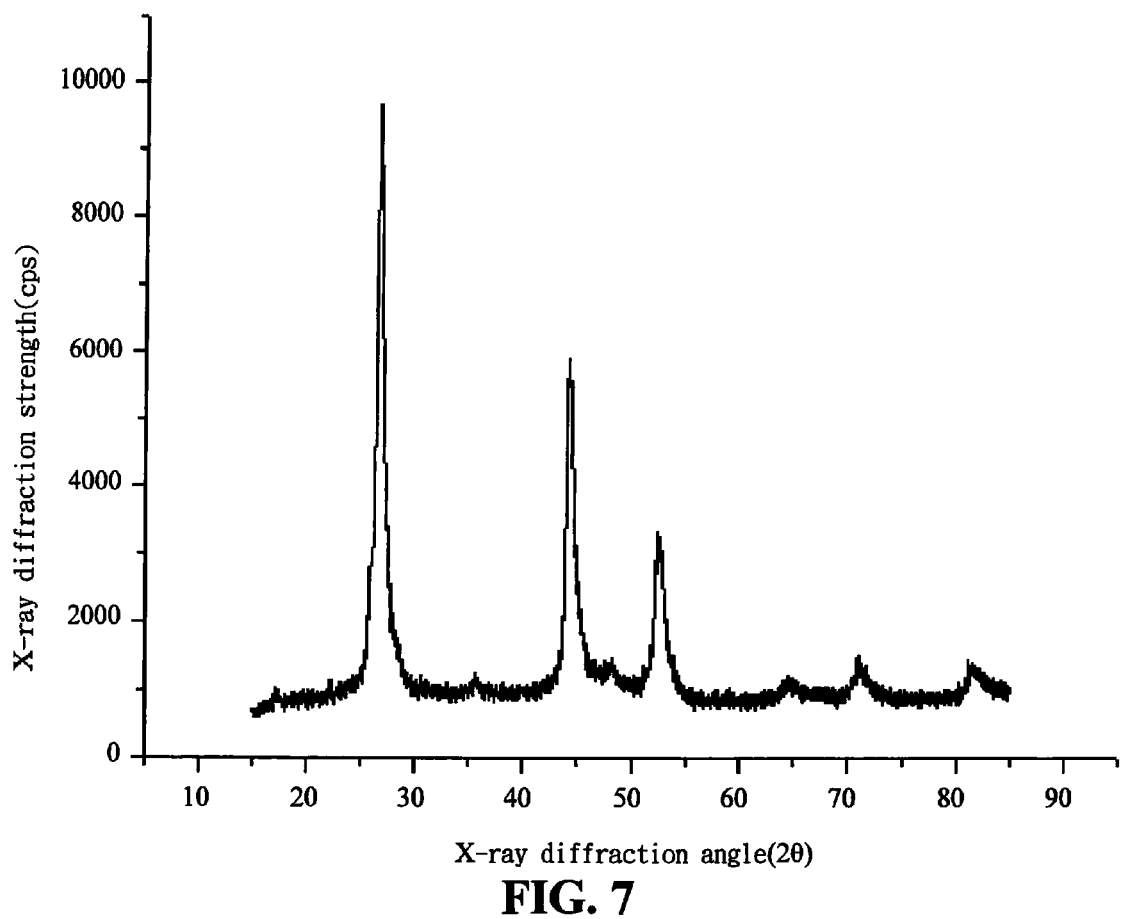
FIG. 7 is a schematic diagram illustrating a crystalline architecture of the multi-element metal chalcogenide of FIG. 6.

FIG. 7 is a schematic diagram illustrating a crystalline architecture of the multi-element metal chalcogenide of FIG. 6. Referring to FIG. 7, there is shown an X-ray diffraction (XRD) analysis pattern of the CIGS powder obtained in accordance with the embodiment of FIG. 6. As shown in FIG. 7, characteristic peaks of the $Cu_{0.9}(In,Ga)Se_{1.9}$ include 112 (27.19), 204/220(44.69), 116/312(52.81), 008/400(65.02), 316/332(71.25), 228/424(82.18). Very rare impurities are detected. As determined by an energy dispersive X-ray spectroscopy (EDS), the mole ratio of Cu/(In+Ga) is about 0.9, and the mole ratio of Ga/(In+Ga) is about 0.2.

Figure 8:
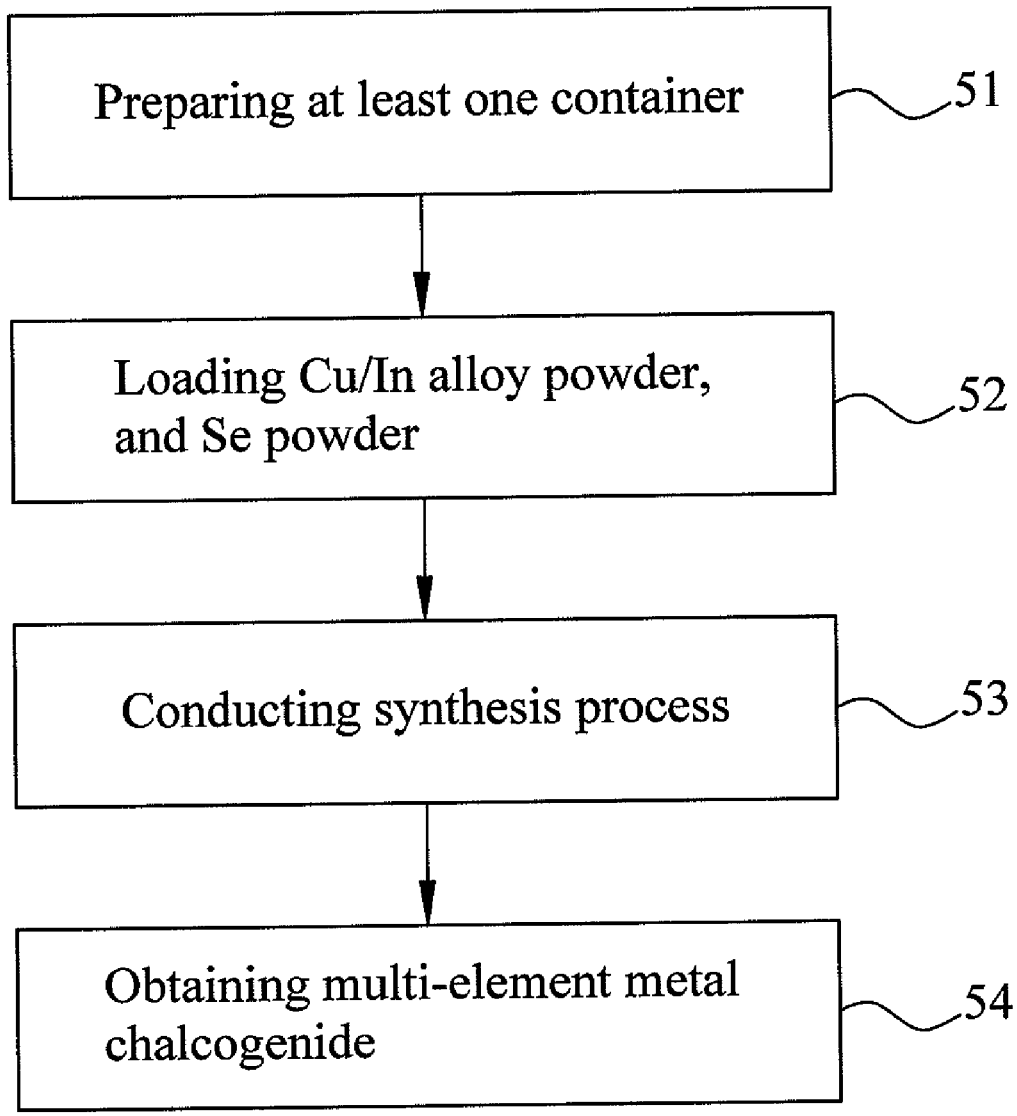
FIG. 8 is a flow chart illustrating a method for preparing still another multi-element metal chalcogenide according to an embodiment of the present invention.

FIG. 8 is a flow chart illustrating a method for preparing still another multi-element metal chalcogenide according to an embodiment of the present invention.

Referring to FIG. 8, at step 51, at least one container is prepared, and then the flow goes to step 52.

At step 52, a 500 ml container, e.g., a three-necked bottle is heated to 100° C., and then an inert gas (e.g., nitrogen, helium, or argon) is introduced into the container to dewater and deoxidize for one hour. Then, one or more alloy powders, e.g., Cu/In alloy powder, and selenium powder, are provided with $N_2$—$H_2$ or $N_2$ and maintained under a temperature of 200° C. for about 0.5 hour. The particle size of the Cu/In alloy powder is less than 100 μm, and the particle size of the selenium powder is small than 300 mesh. The Cu/In alloy powder, and the selenium powder are put in the container, in which the mole ratio of the ingredients of the mixture is Co:In:Se=0.18:0.18:0.38. Then, the flow goes to step 53.

At step 53, 1.2 mole of 2-aminobenzonitrile (organic solvent) is prepared and added into the container, i.e., the three-necked bottle, for dissolving the Cu/In alloy powder and the selenium powder. The 2-aminobenzonitrile has a boiling point higher than 240° C., and has a pH value between 7 and 10. A magnet is employed to stir the mixture for about 1 hour, and the mixture is slowly heated to 240° C. After the temperature of the mixture is stably maintained at 240° C., the operation condition is maintained 24 hours for reaction, and then the flow goes to step 54.

At step 54, the operation temperature is cooled down to 80° C. or lower, and then 160 ml of non-solvent (e.g., methanol or toluene) is introduced, so as to deposit, filter, and separate out black copper-indium-selenium (CIS) sediment powder. Then, the CIS sediment powder is then flushed with non-solvent (e.g., methanol or toluene). Then, the CIS powder is dried in a vacuum environment under a temperature of 50° C. or above for 1 hour.

Figure 9:
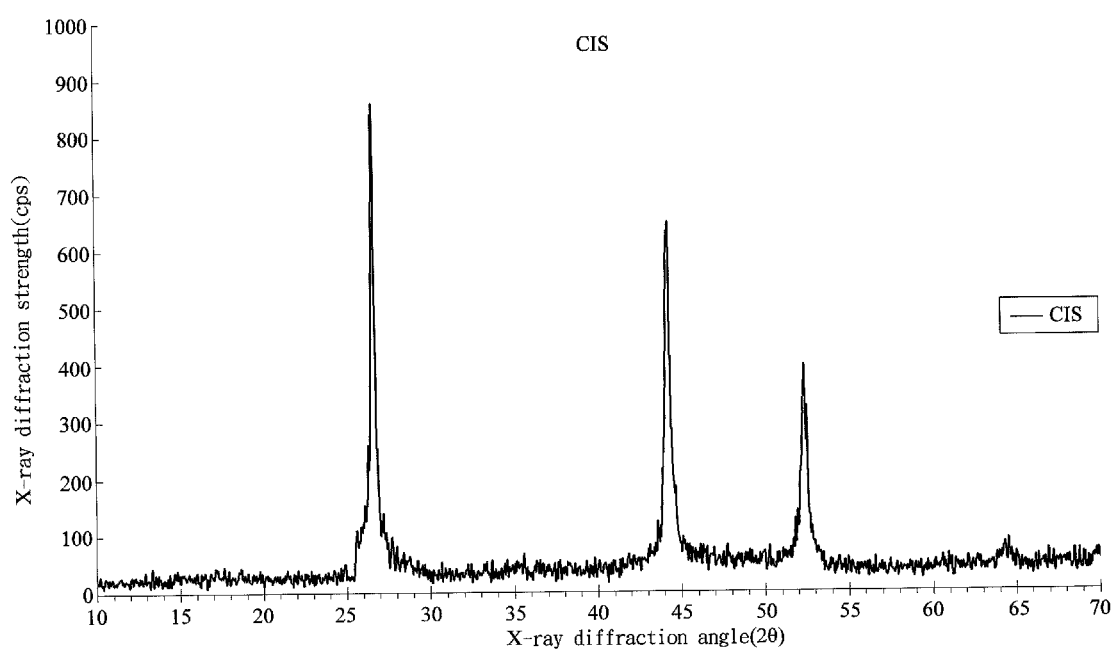
FIG. 9 is a schematic diagram illustrating a crystalline architecture of the multi-element metal chalcogenide of FIG. 8.

FIG. 9 is a schematic diagram illustrating a crystalline architecture of the multi-element metal chalcogenide of FIG. 8. Referring to FIG. 9, there is shown an X-ray diffraction (XRD) analysis pattern of the CIGS powder obtained in accordance with the embodiment of FIG. 8. As shown in FIG. 9, characteristic peaks of the Cu InSe$_2$ include 112(26.60), 204/220(44.25), 116/312(52.35). Very rare impurities are detected.

In accordance with the foregoing embodiments, a multi-element metal chalcogenide adapted for being applied in a semiconductor solar cell, and a method for preparing such a multi-element metal chalcogenide are provided. According to the present invention, the multi-element metal chalcogenide includes multiple metal elements. According to the method of preparing the multi-element metal chalcogenide, a powder of the multi-element metal chalcogenide is prepared, and all of the multiple metal elements of the multi-element metal chalcogenide are derived from simple substance powders of the metal elements, and/or one or more alloy powders mixed in accordance with a mole ratio. Then, a solution phase synthesis is conducted under the normal pressure to prepare the multi-element metal chalcogenide. The solution phase synthesis can be conducted under a normal pressure to cause a cheletropic reaction and preparing the multi-element metal chalcogenide, i.e., CIGS compound, and does not require high pressure operation condition. The organic solvent used in the solution phase synthesis is an aromatic amine having a boiling point higher than 240° C. and a pH value between 7 and 10. The product does not contain any halide ions, and is adapted for mass production. The CIGS compound material is adapted for an active layer of a semiconductor solar cell. The CIGS compound material can be coated to obtain a film or used to make a target and then bombard the target for sputtering a film. In such a way, a selenization process which is conventional in fabricating the semiconductor solar cell is eliminated, thus improving the production yield and efficiency.

In general, the multi-element metal chalcogenide and the method for preparing such a multi-element metal chalcogenide of the present invention have the following advantages:

1. The multi-element metal chalcogenide and the method for preparing such a multi-element metal chalcogenide are adapted for being applied in a semiconductor solar cell. According to the present invention, the multi-element metal chalcogenide includes multiple metal elements. According to the method of preparing the multi-element metal chalcogenide, a powder of the multi-element metal chalcogenide is prepared, and all of the multiple metal elements of the multi-element metal chalcogenide are derived from simple substance powders of the metal elements, and/or one or more alloy powders mixed in accordance with a mole ratio. Then, a solution phase synthesis is conducted under the normal pressure to prepare the multi-element metal chalcogenide. The solution phase synthesis can be conducted under a normal pressure, and does not require high pressure operation condition. The product does not contain any halide ions, and is adapted for mass production;

2. According to the present invention, a nano-scale GIGS powder can be conveniently produced in a large scale under an ambient atmosphere pressure. Such a nano-scale GIGS powder does not contain halide ions. A GIGS compound material is then made of the nano-scale GIGS powder. The mole ratios of the Cu, In, Ga, and Se ingredients of the GIGS compound material can be adjusted within a certain range as desired, for improving the cell-efficiency according to the processing requirement. Further, the GIGS compound material can be used to fabricate uniform-ingredient ink and sputtering target which are adapted for conducting a stable process and producing a high quality GIGS thin film;

3. According to the present invention, a GIGS compound material is obtained. The GIGS compound material is adapted for an active layer of a semiconductor solar cell. The GIGS compound material can be coated to obtain a film or used to make a target and then bombard the target for sputtering a film. In such a way, a selenization process which is conventional in fabricating the semiconductor solar cell is eliminated, thus improving the production yield and efficiency.

Although the present invention has been described with reference to the preferred embodiments thereof, it is apparent to those skilled in the art that a variety of modifications and changes may be made without departing from the scope of the present invention which is intended to be defined by the appended claims.

The invention claimed is:

1. A method for preparing a multi-element metal chalcogenide, comprising:
preparing at least one container;
loading one or more pure metal element powders, and/or one or more alloy powders, together with a chalcogen into the container;
introducing an organic solvent into the container, wherein the organic solvent has a boiling point higher than 240° C., and a pH value between about 7 and about 10; and
conducting a synthesis process comprising heating pure metal element powders, and/or the alloy powders, the chalcogen, and the organic solvent to a reaction temperature for synthesizing the multi-element metal chalcogenide, wherein the reaction temperature is maintained above 200° C.

2. The method as claimed in claim 1, wherein the one or more pure metal element powders are selected from the group consisting of simple substances of copper (Cu), indium (In), gallium (Ga), and the chalcogen is selected from the group consisting of simple substances of sulfur (S), selenium (Se), and tellurium (Te).

3. The method as claimed in claim 2, wherein the organic solvent is an aromatic amine and can be represented by one of the following formulas:

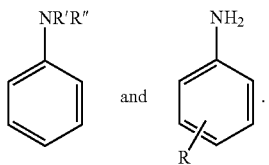

4. The method as claimed in claim 3, wherein R' and R" presented in the formula are two selected from the group consisting of hydrogen atom, aromatic group, amino group having 1 to 5 carbon atoms, and alcohol group having 1 to 5 carbon atoms.

5. The method as claimed in claim 4, wherein the organic solvent is selected from the group consisting of diphenylamine, N-phenylbenzylamine, 2-anilinoethanol, and N-phenylethylene-diamine.

6. The method as claimed in claim 2, wherein the organic solvent is an aromatic amine and can be represented by one of the following formulas:

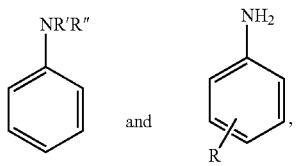

and wherein R presented in the formula represents one selected from the group consisting of hydrogen atom, alkyl group having 1 to 10 carbon atoms, amino group having 1 to 10 carbon atoms, alkoxy group having 1 to 10 carbon atoms, nitrile group, and aromatic group.

7. The method as claimed in claim 6, wherein the organic solvent is selected from the group consisting of 4-butylaniline, 2-biphenylylamine, 2-aminobenzonitrile, N,N-diethyl-1,4-phenylenediamine, and o-phenetidine.

8. The method as claimed in claim 2, wherein the organic solvent is an aromatic amine and can be represented by one of the following formulas:

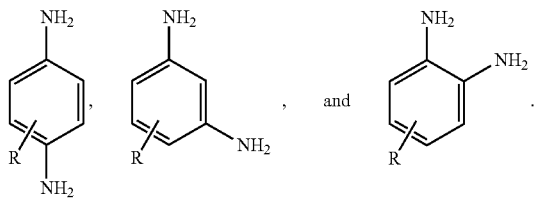

9. The method as claimed in claim 8, wherein R presented in the formula represents one selected from the group consisting of hydrogen atom, alkyl group having 1 to 10 carbon atoms, nitrile group, and aromatic group.

10. The method as claimed in claim 9, wherein the organic solvent is selected from the group consisting of (1,2-phenylenediamine), (1,3-phenylenediamine), (1,4-phenylenediamine), and (4-methyl-1,3-phenylenediamine).

11. The method as claimed in claim 2, wherein before conducting the synthesis process, the container is preheated to about 100° C., and an inert gas is introduced for dewatering and deoxidizing, and wherein the inert gas is selected from the group consisting of nitrogen, helium, and argon.

12. The method as claimed in claim 2, wherein the organic solvent is a mixture of two different solvents.

13. The method as claimed in claim 2, wherein the multi-element metal chalcogenide has a formula of $Cu_x(In_{1-y}Ga_y)Se_z$, wherein $0.8 \leq x \leq 1.2$, $0 \leq y \leq 1.0$, and $1.6 \leq z \leq 2.4$.

14. The method as claimed in claim 1, wherein the one or more alloy powders are selected from the group consisting of Cu/In alloy, and Cu/Ga alloy, and the chalcogen is selected from the group consisting of simple substances of sulfur (S), selenide (Se), and tellurium (Te).

15. A method for preparing a nano-scale multi-element metal chalcogenide powder, comprising:
preparing at least one container;
loading one or more pure metal element powders, and/or one or more alloy powders, together with a chalcogen into the container;
introducing an organic solvent into the container, wherein the organic solvent has a boiling point higher than 240° C., and a pH value between about 7 and about 10;
conducting a synthesis process comprising heating pure metal element powders, and/or the alloy powders, the chalcogen, and the organic solvent to a reaction temperature for synthesizing a multi-element metal chalcogenide, wherein the reaction temperature is maintained above 200° C.; and
forming the nano-scale multi-element metal chalcogenide powder by conducting a cooling down step, a precipitation step, a filtering step, a flushing step, and a drying step to the multi-element metal chalcogenide.

16. method as claimed in claim 15, wherein the cooling down step comprises cooling down the multi-element metal chalcogenide to about 80° C. or lower, and the precipitation step comprises adding a first non-solvent for separating the multi-element metal chalcogenide out, wherein the first non-solvent is either methanol or toluene, and/or the flushing step comprises flushing the multi-element metal chalcogenide with a second non-solvent, wherein the second non-solvent is either methanol or toluene, and/or the drying step comprises drying the multi-element metal chalcogenide in a vacuum environment at a temperature of about 50° C. for about 1 hour.

17. The method as claimed in claim 15, wherein the nano-scale multi-element metal chalcogenide powder is applied in a sputtering process or an ink-printing process for forming a multi-element metal chalcogenide thin film.

18. A multi-element metal chalcogenide, obtained by heating a mixture of one or more pure metal element powders, a chalcogen, and an organic solvent to a reaction temperature for conducting a synthesis process, wherein the organic solvent has a boiling point higher than 240° C., and a pH value between about 7 and about 10, and the reaction temperature is maintained above 200° C.

* * * * *